United States Patent [19]
Kim

[11] Patent Number: 5,955,746
[45] Date of Patent: *Sep. 21, 1999

[54] SRAM HAVING ENHANCED CELL RATIO

[75] Inventor: Jae-Kap Kim, Ichon, Rep. of Korea

[73] Assignee: Hyundai Electronics Industries Co., Ltd., Ich'on, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/825,073

[22] Filed: Mar. 27, 1997

[30] Foreign Application Priority Data

Mar. 28, 1996 [KR] Rep. of Korea ..................... 96-8940

[51] Int. Cl.$^6$ ..................................................... H01L 29/72
[52] U.S. Cl. ........................... 257/69; 257/336; 257/344; 257/393; 257/407; 257/408; 257/904
[58] Field of Search ............................. 257/69, 336, 344, 257/408, 903, 904, 393

[56] References Cited

U.S. PATENT DOCUMENTS

| | | | |
|---|---|---|---|
| 4,499,652 | 2/1985 | Shrivastava | 29/571 |
| 5,047,818 | 9/1991 | Tsukamoto | 357/23.6 |
| 5,324,973 | 6/1994 | Sivan | 257/330 |
| 5,396,098 | 3/1995 | Kim et al. | 257/344 |
| 5,629,546 | 5/1997 | Wu et al. | 257/904 |

FOREIGN PATENT DOCUMENTS

| | | |
|---|---|---|
| 61-241967 | 10/1986 | Japan . |
| 5-121695 | 5/1993 | Japan . |

OTHER PUBLICATIONS

Patent Abstracts of Japan, Publication No. 05121695 (May 18, 1993).

Hori et al., "Quarter–Micrometer SPI (Self–Aligned Pocket Implantation) MOSFET's and Its Application for Low Supply Voltage Operation," IEEE Transation on Electron Devices, vol. 42, No. 1, pp. 78–85, Jan. 1995.

*Primary Examiner*—Edward Wojciechowicz
*Attorney, Agent, or Firm*—Ware, Fressola, Van Der Sluys & Adolphson LLP

[57] ABSTRACT

An SRAM cell and a method of manufacturing the same are disclosed. An SRAM cell including pull down devices, access devices and pull up devices each having source and drain regions with LDD structure, the source and drain regions of the access devices having: $N^+$ source and drain regions; $N^-$ source and drain regions formed under the $N^+$ source and drain regions; and $P^-$ impurity regions whose predetermined portion is overlapped with the $N^-$ source and drain region.

6 Claims, 3 Drawing Sheets

SRAM HAVING ENHANCED CELL RATIO

BACKGROUND OF THE INVENTION

1. Field of the Invention

The present invention relates to a semiconductor memory device and method of manufacturing the same, and more particularly, to a Static Random Access Memory cell capable of enhancing cell ratio and a manufacturing method thereof.

2. Description of the Related Art

A semiconductor memory device is classified into a dynamic random access memory (DRAM) and a static random access memory (SRAM) according to its method of storing data. SRAM is particular significant due to its high speed, low power consumption, and simple operation. In addition, unlike the DRAM, the SRAM has advantage of an easy design as well as not having to regularly refresh stored data.

In general, SRAM cell includes: two driving transistors which are pull-down devices; two access devices; and two pull-up devices. The SRAM cell is further classified as a full CMOS cell, a high road resistor(HRL) cell, or a thin film transistor (TFT) cell according to the type of the pull-up devices used.

The full CMOS cell utilizes a P-channel bulk MOSFET as the pull-up device. The HRL cell utilizes a polysilicon having a high resistance value as the pull-up device, and TFT cell utilizes P-channel polysilicon TFT as the pull-up device. Of the above-mentioned structures, the SRAM cell with the full CMOS cell structure has optimal operational device properties and can be fabricated with a simple process. It, however, has both NMOS and PMOS transistors in the unit cell, resulting in a large cell size. Therefore, it is applied to the memory device having a small capacitance. On the other hand, SRAM cells with the HRL cell and the TFT cell structures have relatively poor performance and is complicated in their fabrication. Because of their smaller cell size, however they are generally applied to semiconductor memory device in cases of larger capacitance.

FIG. 1 is a conventional circuit diagram of an SRAM cell with the full CMOS cell structure.

As shown in this diagram, sources S1 and S2 of PMOS transistors Q1 and Q2 for use in pull-up devices are connected to VDD. Drains D1 and D2 of the PMOS transistors Q1 and Q2 are respectively connected in series to each drains D3 and D4 of NMOS transistors Q3 and Q4 for use in pull-down devices at nodes N1 and N2. Sources S3 and S4 of the NMOS transistors Q3 and Q4 are connected to VSS. Gates G1 and G2 of the PMOS transistors Q1 and Q2 are respectively connected to gates G3 and G4 of the NMOS transistors Q3 and Q4, and these connection points thereof are respectively cross-coupled with the nodes N1, N2. In NMOS transistors Q5 and Q6 for use in access devices, gates G5 and G6 are connected to a word line W/L, sources S5 and S6 are respectively connected to bit lines B/L1 and B/L2. Drains D5 and D6 of NMOS transistors Q5 and Q6 are respectively connected to the drains D3 and D4 of the NMOS transistors Q3 and Q4 at the nodes N1, N2.

In the above described SRAM cell, the NMOS transistors Q5 and Q6 are turned on by turning on the word line W/L, to store data in a HIGH state in the node N1 and data in a LOW state in the node N2. Data in a HIGH state is inputted to the bit line B/L1 and data in a LOW state is inputted to the bit line B/L2, so that the PMOS transistor Q1 and NMOS transistor Q4 are turned on, and PMOS transistor Q2 and NMOS transistor Q3 are turned off. Therefore, the node N1 becomes a HIGH state and the node N2 becomes a LOW state. Furthermore, although the word line W/L is turned off, the node N2 is latched to maintain a LOW state and the node N1 is maintained at a HIGH state. Accordingly, data is stored in the nodes N1 and N2 respectively.

Meanwhile, one of the factors determining the characteristics of the SRAM is the current driving capability ratio of the pull down device, otherwise known as the driving device and the access device ($I_{DSAT\ DRIVER\ TRANSISTOR}/I_{DSAT\ ACCESS\ TRANSISTOR}$), otherwise known as cell ratio. A higher cell ratio results in improved performance of the SRAM. Therefore when the current amount of the pull down device is large and the current amount access device is small, the performance of the SRAM cell is improved.

An operation of the SNAM related to the cell ratio is as follows. In case the data in a low state is stored in the node N1 and the data in a high state is stored in the node N2, the voltage of the node N1 is determined by the current amount ratio of the NMOS transistors Q5 and Q6 for use in access devices and the NMOS transistors Q3 and Q4 for use in pull down devices. Accordingly, the node N1 is intended to maintain the low voltage with the increase of the current amount of the NMOS transistors Q3 and Q4, and with the decrease of that of the NMOS transistors Q5 and Q6. If so, the voltage of the node N1 is not drastically changed from the low state when the NMOS transistors Q5 and Q6 are turned on during the reading operation, even though the voltage of the bit line B/L1 is changed. In case the voltage variation of the node N1 is small, the voltage of the cross-coupled node N2 is still maintained in the high state.

Therefore, conventionally, the cell ratio is controlled in a manner wherein width of the NMOS transistor for use in access device is reduced and its length is increased to thereby reduce its the current amount, and width of the NMOS transistor for use in pull-down device is increased and its length is reduced to thereby increase its the current amount. The width and length of the transistor, however, cannot be reduced below a predetermined level, and therefore there is a restriction in reducing the size of the cell to enhance the cell ratio.

SUMMARY OF THE INVENTION

Accordingly, an object of the present invention is to provide an SRAM cell and manufacturing method of the same, which selectively reduce the concentration of impurity ion of source/drain regions of an access devices, and increases a parasitic resistance of the access devices, thereby reducing the current amount of access devices and enhancing the cell ratio of the SRAM cell.

In accordance with one embodiment, there is provided a SRAM cell including pull down devices, access devices and pull up devices, the source and drain regions of the access device having; N$^+$ source and drain regions; N$^-$ source and drain regions formed under the N$^+$ source and drain regions; and a P$^-$ impurity region wherein a predetermined portion thereof, is overlapped with the N$^-$ source and drain regions.

In this embodiment, a concentration of N type impurity of a region wherein said P$^-$ impurity region and said N$^-$ source and drain regions of said access devices are overlapped, is lower than that of said N$^-$ source and drain regions.

There is also provided a method of manufacturing an SRAM cell having pull down devices, access devices and pull up devices, the manufacturing method including the steps of: providing a semiconductor substrate of which an active region is defined and a gate insulating layer and a gates are formed on thereof; respectively forming N$^-$ source and drain regions in the substrate of both sides of gates of the pull down devices region and the access devices region; and forming P⁻ impurity regions on predetermined portions of the N⁻ source and drain regions of the access devices region.

In this embodiment, the impurity concentration of the P⁻ impurity regions is lower than that of the N⁻ source and drain regions.

BRIEF DESCRIPTION OF THE ATTACHED DRAWINGS

The objects and feature of the invention may be better understood with reference to the following detailed description, appended claims, and attached drawings wherein:

DETAILED DESCRIPTION OF PREFERRED EMBODIMENT

A preferred embodiment according to the present invention is described below with reference to the attached drawings.

Figure 1:
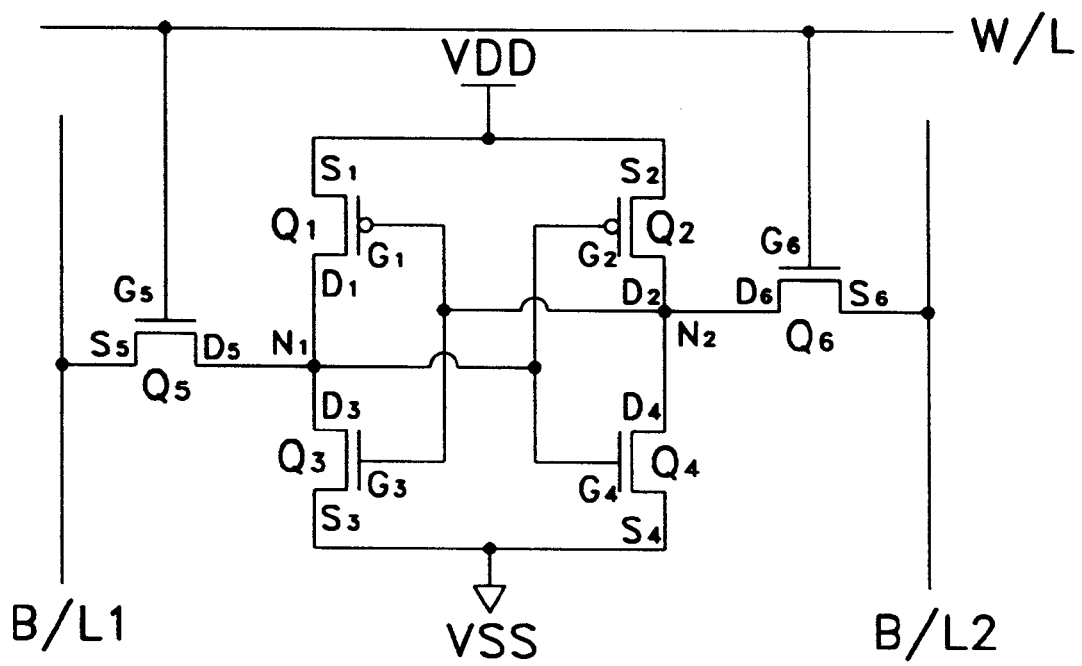
FIG. 1 is an equivalent circuit diagram of a conventional SRAM cell having a full CMOS structure.
Figure 2:
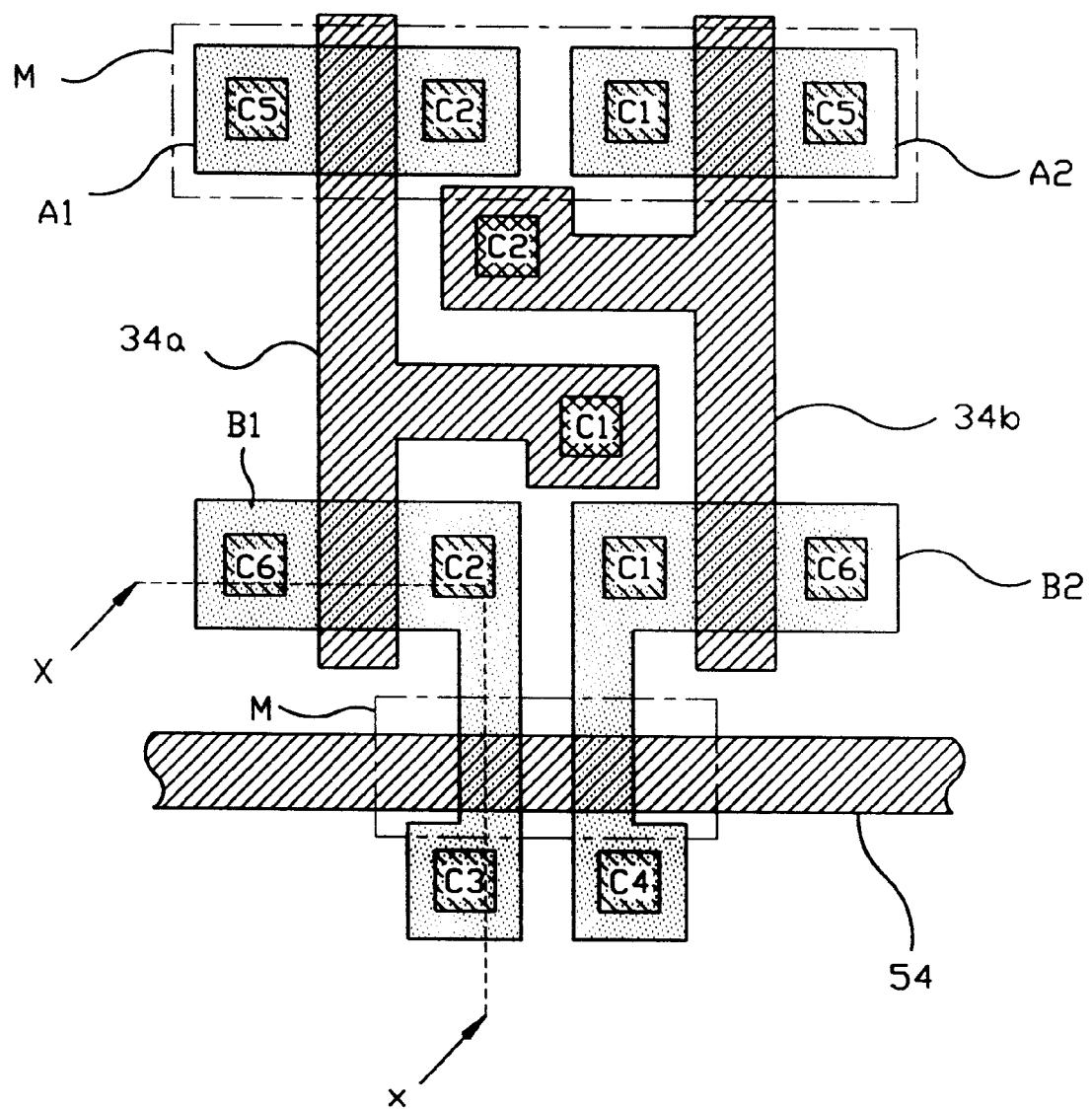
FIG. 2 is a plan view of an SRAM cell having a full CMOS structure in accordance with a preferred embodiment of the present invention.

Referring to FIG. 2 with cross reference to FIG. 1, A1 and A2 denote the active regions of PMOS transistors Q1 and Q2 for use in pull up devices, B1 and B2 denote the active regions of NMOS transistors Q3 and Q4 for use in pull down devices and NMOS transistors Q5 and Q6 for use in access devices. C1 to C6 denote contact regions. Here, contact regions C1 and C2 denote node contact regions of node N1 and N2. The NMOS transistors Q3 and Q4 for use in pull down devices and the NMOS transistors Q5 and Q6 for use in access devices have in common the node contact regions C1 and C2 with in active regions B1 and B2 respectively. C3 and C4 denote contact regions of source S5 and S6 of the NMOS transistors Q5 and Q6. C5 denotes contact regions of source S1 and S2 of PMOS transistor Q1 and Q2, and C6 denotes contact regions of source S3 and S4 of the NMOS transistor Q3 and Q4. There are also provided gate lines 34a, 34b, 54 and mask pattern M used for forming P⁻ source/drain regions of the PMOS transistors Q1 and Q2 for use in pull up devices. The word line 54 also serves as a word line of the transistors Q5 and Q6. Here, the mask pattern M is an open pattern to expose the active regions A1 and A2 of the NMOS transistors Q3 and Q4 for use in pull down devices, and also expose a predetermined portion of the active regions B1 and B2 on both sides of the word line 54 of the NMOS transistors Q5 and Q6 for use in access devices.

Meanwhile, FIG. 2 illustrates only the pull CMOS SRAM cell structure, the above structure can be also applied to the HRL SRAM and P-channel polysilicon TFT SRAM structures.

Figure 3A:
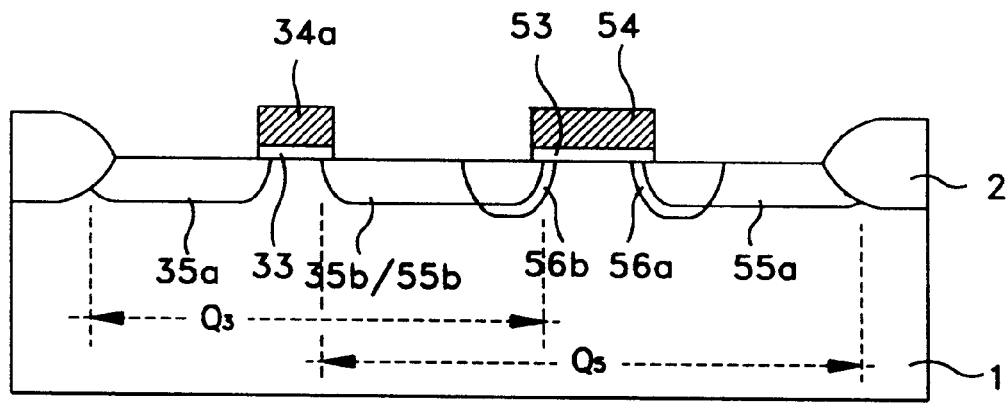
FIGS. 3A and 3B are sectional views showing a method for manufacturing the SRAM cell in accordance with a preferred embodiment of the present invention.
Figure 3B:
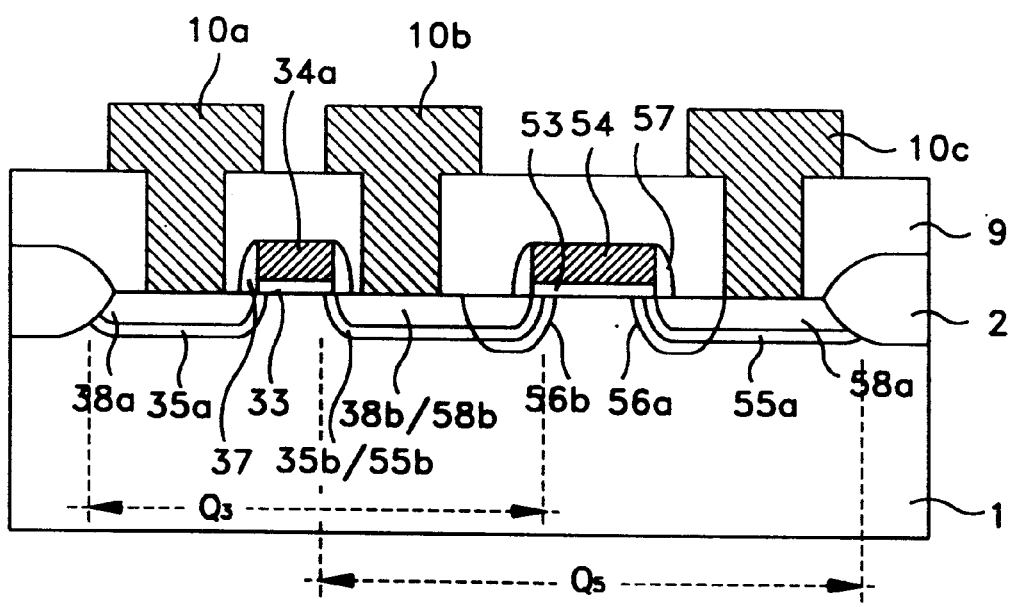

FIGS. 3A and 3B are the sectional views of an NMOS transistor Q3 for use in pull down device and the NMOS transistor Q5 for use in access device of SRAM cell taken along the line X–X' of FIG. 2. With reference to FIGS. 3A and 3B, a manufacturing method of the above-mentioned SRAM cell will be described below in detail.

As illustrated in FIG. 3A, isolating layers 2 are formed on a predetermined portion of a semiconductor substrate 1. Gate insulating layers 33 and 53, and gates 34a and 54 are respectively formed on the substrate between the isolating insulating layers 2 Thereafter, an N⁻ impurity ion, preferably P ion, is ion implanted into substrate 1 of both sides of the gates 34a and 54 to a concentration of $2 \times 10^{13}$ to $5 \times 10^{13}$ ions/cm². Therefore, N⁻ source regions 35a and 55a and common N⁻ drain region 55b/55b of the NMOS transistor Q3 for use in pull down device and NMOS transistor Q5 for use in access device are formed in the substrate 1. P⁻ impurity ion, preferably B or BF₂ ion is then ion implanted to a concentration of $1 \times 10^{13}$ to $3 \times 10^{13}$ ions/cm² into a predetermined portion of the N⁻ source/drain region 55a and 55b both sides of the gate 54 of the NMOS transistor Q5 for use in access device. Therefore, a predetermined portion of the N⁻ source and drain regions 55a and 55b of the NMOS transistor Q5 for use in access device is overlapped wherein P⁻ ion implanted regions 56a and 56b are formed.

Here, even though a process for forming P⁻ source and drain regions of the PMOS transistors Q1 and Q2 for use in pull up devices is not illustrated, the P⁻ ion implanted regions 56a and 56b are formed with the P⁻ source and drain regions during the above process for forming P⁻ source and drain regions by the ion implanting process using the mask pattern M(refer to FIG. 2). The concentration of B ion, which is the P⁻ type impurity ion of the P⁻ ion implanted regions 56a and 56b, should be lower than that of P ion, which is the N type impurity ion of the N⁻ source and drain regions 35b/55b and 55a. Accordingly, the concentration of the N type impurity of the access transistor Q5 becomes lower than that of the N type impurity of other NMOS transistor Q3. That is, the concentration of P ion, which is the N type impurity ion of the N⁻ source and drain regions 55a and 55b of the NMOS transistor Q5 for use in access device, is about $2 \times 10^{18}$ to $5 \times 10^{18}$ ions/cm³. The concentration of B ion, which is the P type impurity ion of the P⁻ ion implanted regions 56a and 56b, is about $1 \times 10^{18}$ to $3 \times 10^{18}$ ions/cm³. Accordingly the concentration of the N type impurity of regions wherein the N⁻ source and drain regions 55a and 55b, and the P⁻ ion implanted regions 56a and 56b are overlapped, is about $1 \times 10^{18}$ to $2 \times 10^{18}$ ions/cm³.

As illustrated in FIG. 3B, the insulating layer, preferably, an oxide layer or nitride layer is deposited on the structure of FIG. 3A. The insulating layer is then etched by the anisotropic blanket etching, so that LDD spacers 37 and 57 of the insulating layer are formed on both side walls of the gates 34a and 54. Thereafter N⁺ impurity ion, preferably, As ion is ion implanted to a concentration of $1 \times 10^{15}$ to $7 \times 10^{15}$ ions/cm² into the substrate 1 of both sides of spacers 37 and 57, so that the source and drain regions 38a, 38b/58b and 58a of the NMOS transistor Q3 for use in pull down device and the NMOS transistors Q5 for use in access device are formed respectively. Here, the concentration of As, which is the N type impurity ion of the N⁺ source and drain regions 38a, 38b/58b and 58a, is about $3 \times 10^{19}$ to $3 \times 10^{20}$ ions/cm³.

An intermediate insulating layer 9 is then formed on the overall surface of the substrate, and etched to expose the contact portion of the N+ source and drain regions 38a, 38b/58b and 58a, thereby forming contact holes. A metal layer is then deposited on the intermediate insulating layer 9 to fill the contact holes. The metal layer is then patterned thereby forming metal interconnection layers 10a, 10b and 10c.

According to the present invention, a predetermined portion of the N⁻ source and drain regions is overlapped with the P⁻ ion implanted region in the access devices of SRAM cell, so that the concentration of the impurity ion of the N⁻ source and drain regions is selectively low, thereby increasing the parasitic resistance of access devices. Accordingly, the current amount of the access devices is also decreased, thereby enhancing the cell ratio of the SRAM cell.

Furthermore, the invention can implement higher integration of device by reducing the size of the cell.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as falling within the true scope of the invention.

What is claimed is:

1. An SRAM cell including pull down devices, access devices and pull up devices, wherein source and drain regions of said access device comprise:

N+ source and drain regions;

N− source and drain regions formed under said N+ source and drain regions; and a P− impurity region wherein predetermined portion thereof is overlapped with said N− source and drain regions.

2. The SRAM cell as claimed in claim 1, wherein a concentration of N type impurity of a region in which said P− impurity region and said N− source and drain regions of said access devices are overlapped is lower than that of said N− source and drain regions.

3. The SRAM cell as claimed in claim 2, wherein said concentration of N type impurity region of the overlapped portion of said access devices is $1 \times 10^{18}$ to $2 \times 10^{18}$ ions/cm$^3$, and that of the N− source and drain regions is $2 \times 10^{18}$ to $5 \times 10^{18}$ ions/cm$^3$.

4. The SRAM cell as claimed in claim 1, wherein said pull up devices are P channel bulk MOSFETs.

5. The SRAM cell as claimed in claim 1, wherein said pull up device are resistors.

6. The SRAM cell as claimed in claim 1, wherein said pull up device are P channel polysilicon TFTs.

* * * * *

UNITED STATES PATENT AND TRADEMARK OFFICE
CERTIFICATE OF CORRECTION

PATENT NO : 5,955,746
DATED : September 21, 1999
INVENTOR(S): J. Kim

It is certified that error appears in the above-identified patent and that said Letters Patent are hereby corrected as shown below:

At col. 2. line 15, please cancel "SNAM" and substitute --SRAM-- therefor.

At col. 4, line 3, please insert "." after "2"; and at line 7, please cancel "55b/55b" and substitute --35b/55b-- therefor.

Signed and Sealed this

Eighteenth Day of April, 2000

Attest:

Q. TODD DICKINSON

*Attesting Officer*    *Director of Patents and Trademarks*